United States Patent
Zhao

(10) Patent No.: US 9,897,828 B2
(45) Date of Patent: Feb. 20, 2018

(54) APPARATUS FOR PACKAGING LIQUID CRYSTAL GLASS SUBSTRATES

(71) Applicant: SHENZHEN CHINA STAR OPTOELECTRONICS TECHNOLOGY CO., LTD., Shenzhen, Guangdong (CN)

(72) Inventor: Zhilin Zhao, Guangdong (CN)

(73) Assignee: SHENZHEN CHINA STAR OPTOELECTRONICS TECHNOLOGY CO., LTD, Shenzhen (CN)

(*) Notice: Subject to any disclaimer, the term of this patent is extended or adjusted under 35 U.S.C. 154(b) by 155 days.

(21) Appl. No.: 14/008,072

(22) PCT Filed: Jun. 29, 2013

(86) PCT No.: PCT/CN2013/078483
§ 371 (c)(1),
(2) Date: Sep. 27, 2013

(87) PCT Pub. No.: WO2014/176825
PCT Pub. Date: Nov. 6, 2014

(65) Prior Publication Data
US 2017/0184884 A1   Jun. 29, 2017

(30) Foreign Application Priority Data
May 3, 2013   (CN) .......................... 2013 1 0166617

(51) Int. Cl.
*B65D 85/48*   (2006.01)
*G02F 1/13*   (2006.01)
(Continued)

(52) U.S. Cl.
CPC ............. *G02F 1/1303* (2013.01); *B41J 11/02* (2013.01); *H01L 21/67121* (2013.01); *H01L 21/67126* (2013.01)

(58) Field of Classification Search
USPC ....... 206/454, 455, 701, 706, 710, 503, 557, 206/565
See application file for complete search history.

(56) References Cited

U.S. PATENT DOCUMENTS 1,516,775 A * 11/1924 McCarron ............... A47J 47/14
126/266
2,595,113 A *  4/1952 Taberer .................. B65D 13/02
206/499

(Continued)

FOREIGN PATENT DOCUMENTS

CN    86207460 U    8/1987
CN    2663317 Y    12/2004
(Continued)

OTHER PUBLICATIONS

Huanqing He, the International Searching Authority written comments, dated Feb. 2014, CN.

*Primary Examiner* — Jacob K Ackun

(57) ABSTRACT

The present invention discloses an apparatus for packaging liquid crystal glass substrates, comprising multiple housings, a cover and a unit forming member, wherein the multiple housings are overlapped together in vertical direction, the cover covers the topmost housing of the multiple housings, each housing comprises a cavity for receiving a liquid crystal glass substrate, the unit forming member is configured to clamp at least two housings of the multiple housings together as a housing unit, the unit forming member comprises at least one clamp. According to the present invention, even when there are many layers of housings, the (Continued)

center of gravity of housings can be align with each other, and the risk of overturning can be avoided.

12 Claims, 10 Drawing Sheets

(51) Int. Cl.
*H01L 21/67* (2006.01)
*B41J 11/02* (2006.01)

(56) References Cited

U.S. PATENT DOCUMENTS

| | | | | |
|---|---|---|---|---|
| 3,144,016 A * | 8/1964 | Basci | ............... | A47J 27/12 126/265 |
| 3,208,620 A * | 9/1965 | Herdering | ............ | B65D 21/0234 220/4.24 |
| 3,259,263 A * | 7/1966 | Wei | ............... | A47J 47/14 126/369.3 |
| 4,428,145 A * | 1/1984 | Wheeler | ............... | A01K 63/00 137/575 |
| 4,501,355 A * | 2/1985 | Hoffman | ............... | A47K 5/02 100/219 |
| 4,619,363 A * | 10/1986 | Wolfseder | ............. | A45C 7/005 206/372 |
| 5,073,116 A * | 12/1991 | Beck, Jr. | ............... | H05K 7/1069 206/724 |
| 5,421,455 A * | 6/1995 | Clatanoff | ............... | B65D 67/02 206/499 |
| 5,706,965 A * | 1/1998 | Honma | ............... | H05K 5/0021 206/501 |
| 5,950,828 A * | 9/1999 | Bal | ............... | B25H 3/06 206/370 |
| 6,874,634 B2 * | 4/2005 | Riley | ............... | A61L 2/26 206/370 |
| 7,036,673 B2 * | 5/2006 | Jozaki | ............... | B65D 21/0224 220/4.26 |
| 8,544,648 B2 * | 10/2013 | Cleveland | ............ | B65D 21/0223 206/503 |
| 8,621,727 B2 * | 1/2014 | Blais | ............... | H01L 21/67346 206/499 |
| 2007/0095703 A1 | 5/2007 | Kao et al. | | |
| 2014/0332422 A1 * | 11/2014 | Hu | ............... | B65D 85/48 206/320 |

FOREIGN PATENT DOCUMENTS

| | | |
|---|---|---|
| CN | 101342976 B | 6/2010 |
| CN | 102026509 A | 4/2011 |
| CN | 102638970 A | 8/2012 |
| CN | 102642673 A | 8/2012 |
| CN | 102717982 A | 10/2012 |
| KR | 20120063944 A | 6/2012 |

* cited by examiner

APPARATUS FOR PACKAGING LIQUID CRYSTAL GLASS SUBSTRATES

TECHNICAL FIELD OF THE INVENTION

The present invention relates to the packaging and transporting technology of glass substrates used in the manufacture of liquid crystal displays, and more particularly to an apparatus for packaging liquid crystal glass substrates.

BACKGROUND OF THE INVENTION

Currently, there is known an apparatus for packaging liquid crystal glass substrates, as shown in FIGS. 11 and 12, the apparatus for packaging liquid crystal glass substrates comprises a housing 20 and a cover 10, the housing 20 is matched with the cover 10. The housing 20 has a cavity 30, which is used for receiving a liquid crystal glass substrate. The cover 10 can be attached to the housing 20 and detached from the housing 20. However, according to the apparatus for packaging liquid crystal glass substrates, and the transportation efficiency is low, and the occupied storage space is large.

In addition, there is also known another apparatus for packaging liquid crystal glass substrates, as shown in FIGS. 13 and 14, the apparatus for packaging liquid crystal glass substrates comprises a first housing 21, a second housing 22, a third housing 23, a fourth housing 24, a fifth housing 25, and a cover 10. The first housing 21, the second housing 22, the third housing 23, the fourth housing 24, and the fifth housing 25 are overlapped together in vertical direction. Moreover, the first housing 21, the second housing 22, the third housing 23, the fourth housing 24, and the fifth housing 25 share the cover 10, i.e. the cover 10 only covers the first housing 21. In this way, multiple housings share one cover, storage space can be reduced. However, when there are many layers of housings (for example above 10 layers), the centre of gravity of housings are hard to align with each other, such that there is a risk of overturning.

SUMMARY OF THE INVENTION

The present invention provides an apparatus for packaging liquid crystal glass substrates to solve the mentioned problem above.

The present invention is realized in such a way that: An apparatus for packaging liquid crystal glass substrates, comprising multiple housings, a cover and a unit forming member, wherein the multiple housings are overlapped together in vertical direction, the cover covers the topmost housing of the multiple housings, each housing comprises a cavity for receiving a liquid crystal glass substrate, the unit forming member is configured to clamp at least two housings of the multiple housings together as a housing unit, the unit forming member comprises at least one clamp.

According to an embodiment disclosed herein, each clamp is press-fitted with the top surface and the bottom surface of the housing unit According to another embodiment disclosed herein, each clamp is in square-bracket shape.

According to another embodiment disclosed herein, the housing unit comprises three or more housings.

According to another embodiment disclosed herein, each clamp is located at the side of the housing unit.

According to another embodiment disclosed herein, each clamp is made of plastic or metal.

According to another embodiment disclosed herein, each clamp is made of ABS plastic.

According to another embodiment disclosed herein, each clamp is made of HDPE plastic.

According to another embodiment disclosed herein, each clamp is made of PP plastic.

According to another embodiment disclosed herein, each clamp comprises a first clamping portion, a clamping body and a second clamping portion, the first clamping portion and the second clamping portion are connected with the clamping body.

According to another embodiment disclosed herein, each housing is provided with a first groove engaging with the first clamping portion and a second groove engaging with the second clamping portion.

According to another embodiment disclosed herein, the angle between the first clamping portion and the clamping body, and the angle between the second clamping portion and the clamping body are below 90°.

According to another embodiment disclosed herein, both the first clamping portion and the second clamping portion are provided with a hook.

According to another embodiment disclosed herein, each clamp comprises a first clamping portion, a clamping body and a second clamping portion, the first clamping portion and the second clamping portion are connected with the clamping body.

According to another embodiment disclosed herein, each housing is provided with a first groove engaging with the first clamping portion and a second groove engaging with the second clamping portion.

According to another embodiment disclosed herein, the angle between the first clamping portion and the clamping body, and the angle between the second clamping portion and the clamping body are below 90°.

According to yet another embodiment disclosed herein, both the first clamping portion and the second clamping portion are provided with a hook.

According to the present invention, in present invention, the unit forming member is configured to clamp at least two housings of the multiple housings together as a housing unit. Therefore, one or more housing unit can be formed by the unit forming member, even when there are many layers of housings (for example above 10 layers), the centre of gravity of housings can be align with each other, and the risk of overturning can be avoided.

For more clearly and easily understanding above content of the present invention, the following text will take a preferred embodiment of the present invention with reference to the accompanying drawings for detail description as follows.

BRIEF DESCRIPTION OF THE DRAWINGS

The drawings described herein are for illustration purposes only and are not intended to limit the scope of the present disclosure in any way.

DETAILED DESCRIPTION OF PREFERRED EMBODIMENTS

The following detailed description of every embodiment with reference to the accompanying drawings is used to exemplify a specific embodiment, which may be carried out in the present invention. Directional terms mentioned in the present invention, such as "top", "bottom", "front", "rear", "left", "right", "up", "down", "inside", "outside", "side" etc., are only used with reference to the orientation of the accompanying drawings. Therefore, the used directional terms are intended to illustrate, but not to limit, the present invention. Also the following description is merely exemplary in nature and is not intended to limit the present disclosure, application, or uses. Besides, the term "clamp" used herein means an appliance with opposite sides or parts that may be used to hold or compress something.

Figure 1:
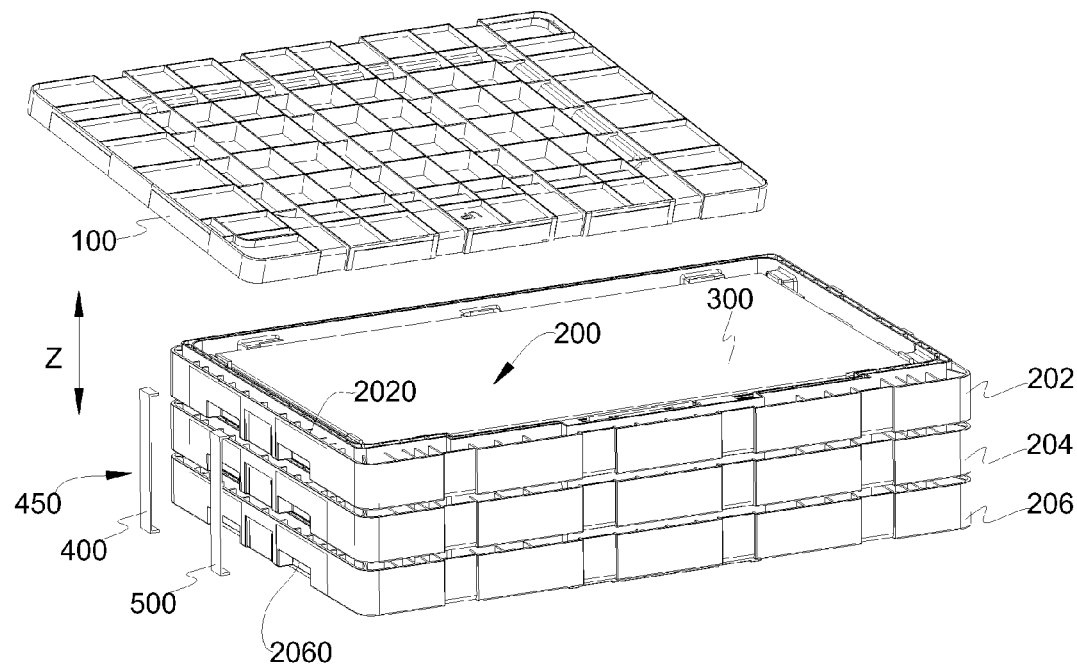
FIG. 1 is a schematic exploded view of the apparatus for packaging liquid crystal glass substrates according to an embodiment of the present invention.
Figure 2:
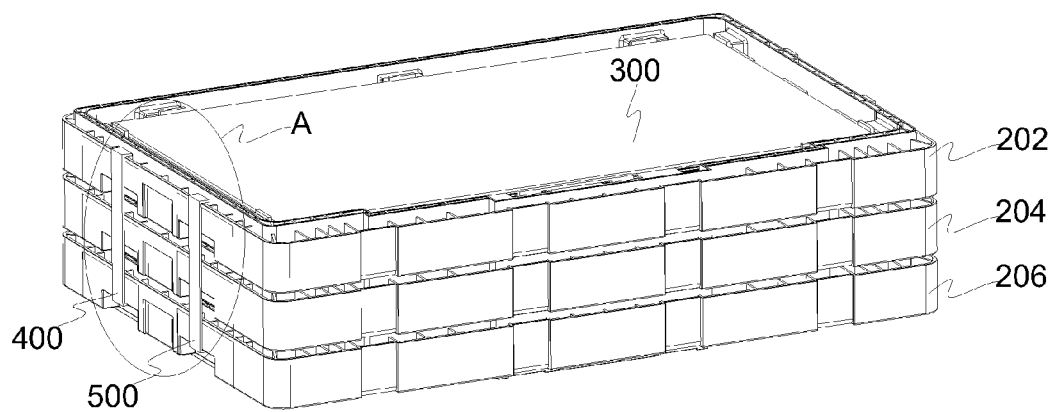
FIG. 2 shows the assembled state of the apparatus for packaging liquid crystal glass substrates in FIG. 1.
Figure 3:
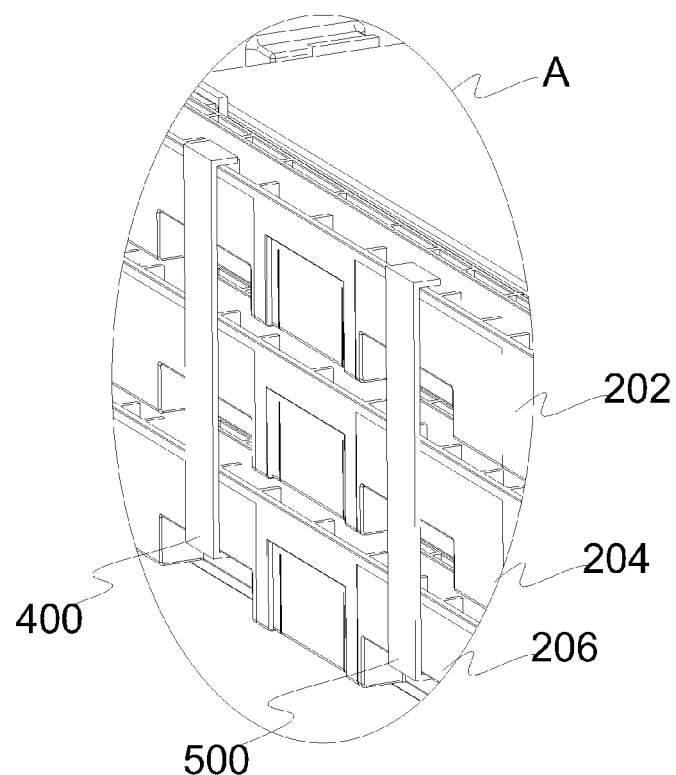
FIG. 3 is an enlarged view of a circled portion A in FIG. 2.

As shown in FIG. 1 through FIG. 3, the apparatus for packaging liquid crystal glass substrates in this embodiment comprises multiple housings, a cover 100 and a unit forming member 450. Although only three housings, i.e. housing 202; housing 204 and housing 206 are shown in the FIG. 1, but the present invention is not limited to it, there may be more housing. In addition, those housings can be the same in shape and configuration. In the embodiment, housing 202; housing 204 and housing 206 are overlapped (i.e. stacked) together in vertical direction Z. housing 202 is the topmost housing; housing 204 is between the housing 202 and housing 206; housing 206 is located at the bottom. Housing 202; housing 204 and housing 206 may be provided with engaging protrusions and engaging recesses on the top and bottom surface, so that housings can engages with each other and thus are positioned with respect to each other in the vertical direction Z. the engaging protrusions and the engaging recesses are configured to engage with each other. The engaging protrusions and the engaging recesses can extend along the edge of the housings to form an end-to-end structure.

The cover 100 covers the topmost housing of the multiple housings. In this embodiment, the cover 100 covers the housing 202. Each housing comprises a cavity 300 for receiving a liquid crystal glass substrate. The cavity 300 can be provided with buffer means and positioning means, so that the liquid crystal glass substrate can be packaged firmly. The unit forming member is configured to clamp at least two housings of the multiple housings together as a housing unit. In this embodiment, the unit forming member 450 is configured to clamp three housings together as a housing unit 200. Although only one housing unit 200 is shown in FIG. 1, there can be two or more housing unit stacked with each other in vertical direction. In transportation, the housing at the bottom of the housing unit 200 will be lift up by conveying tools, and then the whole apparatus for packaging liquid crystal glass substrates will be transported. In present invention, one or more housing unit can be formed by the unit forming member, even when there are many layers of housings (for example above 10 layers), the centre of gravity of housings can be align with each other, and the risk of overturning can be avoided.

In the present invention, the unit forming member comprises at least one clamp. As shown in FIG. 1 and FIG. 2, the unit forming member comprises two clamps, i.e. a first clamp 400 and a second clamp 500. However, the present invention is not limited to it, the unit forming member may comprise three or more clamps, for example, there can be provided with several clamps at each side of the housing unit 200. The first clamp 400 and the second clamp 500 is press-fitted with the top surface 2020 and the bottom surface 2060 of the housing unit 200. As shown in FIG. 1, the top surface 2020 is at the top of the housing unit 200; the bottom surface 2060 is at the bottom of the housing unit 200. In addition, the first clamp 400 and the second clamp 500 is in square-bracket i.e. "[" shape. As shown in FIG. 1 through FIG. 4, the first clamp 400 and the second clamp 500 is provided at the side of the housing unit 200.

Figure 7:
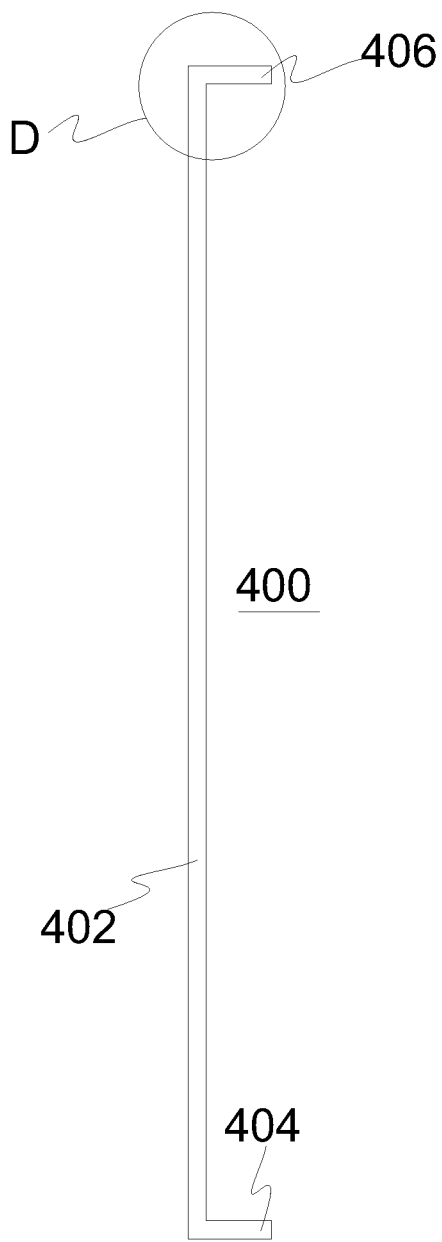
FIG. 7 is a schematic view of the clamp (unit forming member) of the apparatus for packaging liquid crystal glass substrates in FIG. 1.
Figure 9:
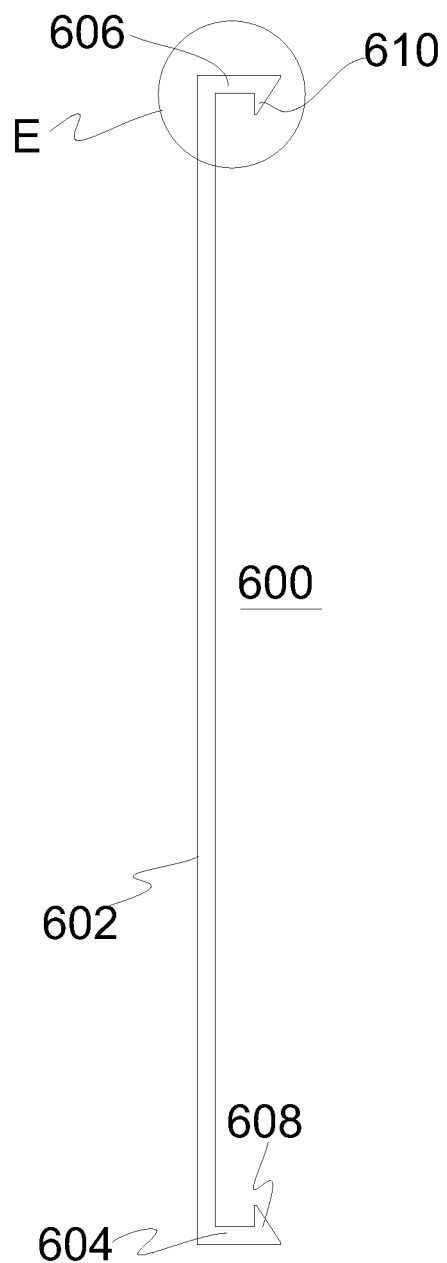
FIG. 9 is a schematic view of a variant of the clamp (unit forming member) of the apparatus for packaging liquid crystal glass substrates.

FIG. 7 and FIG. 9 show two different types of clamp (unit forming member). However, the present invention is not limited to it; other types of clamp (unit forming member) may be adopted. Since the first clamp 400 and the second clamp 500 have the same structure, only the first clamp 400 will described below, the description of the second clamp 500 will be omitted.

Figure 8:
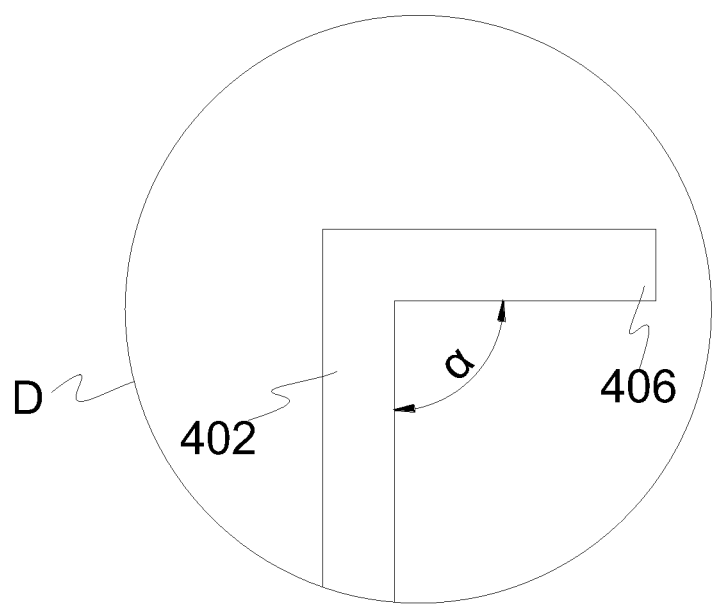
FIG. 8 is an enlarged view of a circled portion D in FIG. 7.

Referring to FIG. 7 and FIG. 8, the first clamp 400 comprises a first clamping portion 404, a clamping body 402 and a second clamping portion 406. The first clamping portion 404 and the second clamping portion 406 are connected with the clamping body 402. The first clamp 400 is preferably integrally moulded (in one piece). In this embodiment, the angle between the first clamping portion 404 and the clamping body 402 is equal to the angle between the second clamping portion 406 and the clamping body 402; and the angle α between the second clamping portion 406 and the clamping body 402 is below 90°. Preferably, the range of the angle α is between 85° and 90°. By means of the resilience of the first clamping portion 404 and the second clamping portion 406 and the elasticity of the housings, the first clamp 400 will be tightly fitted on the housing unit, thus the combination of the housings can be ensured.

In the apparatus for packaging liquid crystal glass substrates, each clamp is made of plastic or metal. For example, the first clamp 400 and the second clamp 500 may be made of ABS (Acrylonitrile butadiene Styrene) plastic; HDPE (high density polyethylene) plastic; or PP (Polypropylene) plastic.

Figure 4:
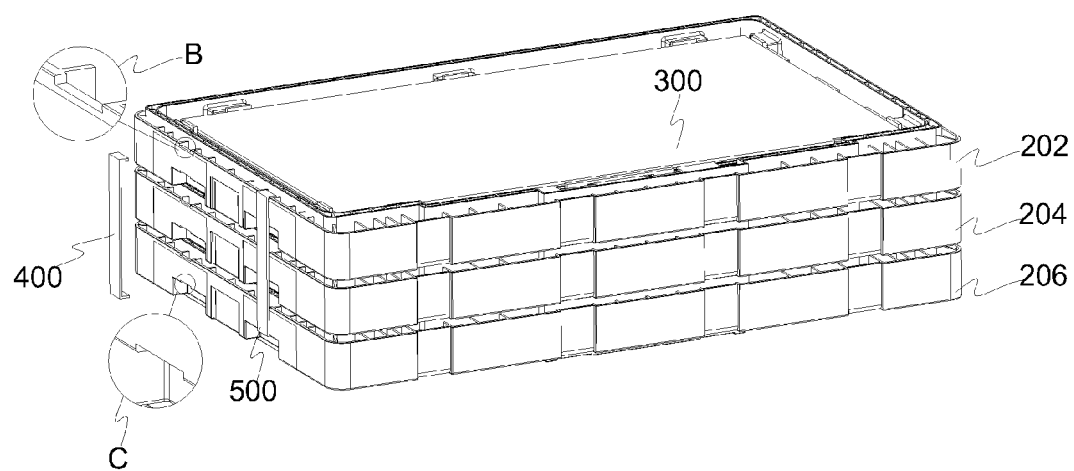
FIG. 4 is a schematic view of the apparatus for packaging liquid crystal glass substrates according to another embodiment of the present invention, which shows the connection relationship of two clamps (unit forming member) and the housings of the apparatus, wherein one clamp is departed form the housings, the other clamp is engaged with the housings.
Figure 5:
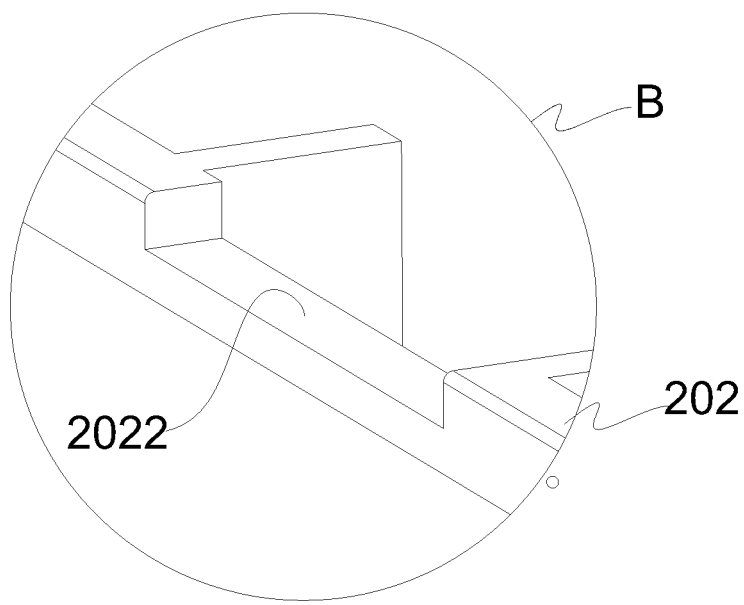
FIG. 5 is an enlarged view of a circled portion B in FIG. 4.
Figure 6:
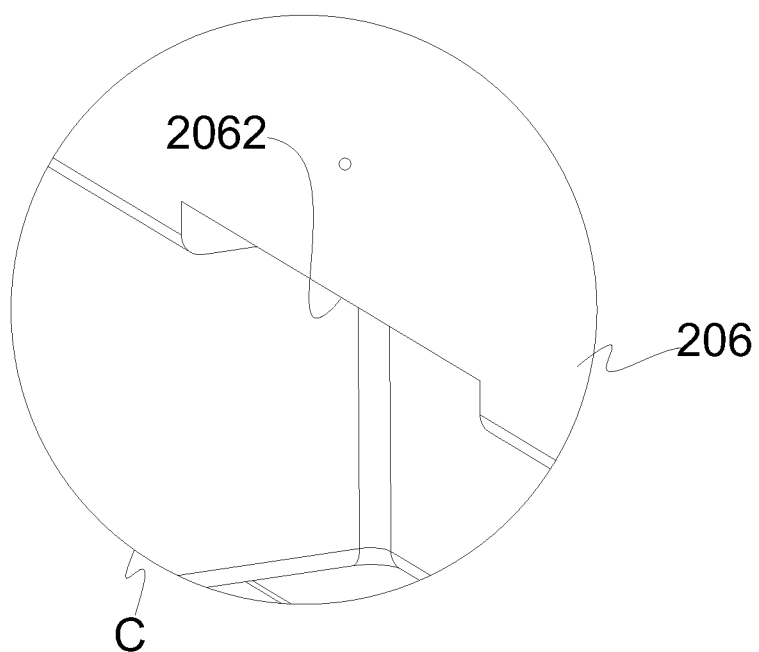
FIG. 6 is an enlarged view of a circled portion C in FIG. 4.

FIG. 4 shows an apparatus for packaging liquid crystal glass substrates according to another embodiment of the present invention, wherein the first clamp 400 is departed form the housings, the second clamp 500 is engaged with the housings. As described above, each clamp comprises a first clamping portion, a clamping body and a second clamping portion. Each housing is provided with a first groove engaging with the first clamping portion and a second groove engaging with the second clamping portion. Not all of the first groove and the second groove will be used in the specific circumstances. In this embodiment, only the first groove 2062 of the housing 206 and the second groove 2022 of the housing 202 are used. To be specific, the housing 206 is provided with a first groove 2062 engaging with the first clamping portion 404 and a second groove (not marked) as shown in FIG. 6; the housing 202 is provided with a first groove (not marked) engaging with the first clamping portion and a second groove 2022 engaging with the second clamping portion 406 as shown in FIG. 5. By means of the grooves (notch) on the housings, the housing unit can be united as one unit more firmly, and the apparatus for packaging liquid crystal glass substrates can have a better appearance.

Figure 10:
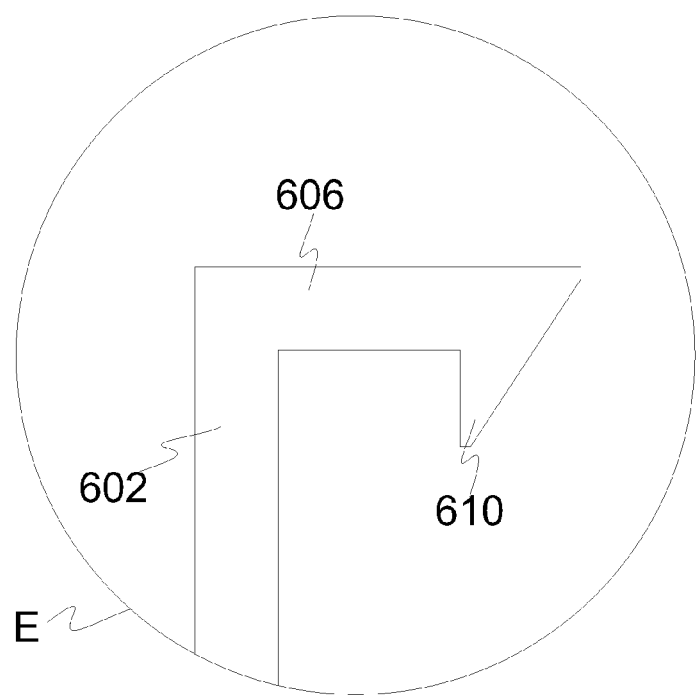
FIG. 10 is an enlarged view of a circled portion E in FIG. 9.
Figure 11:
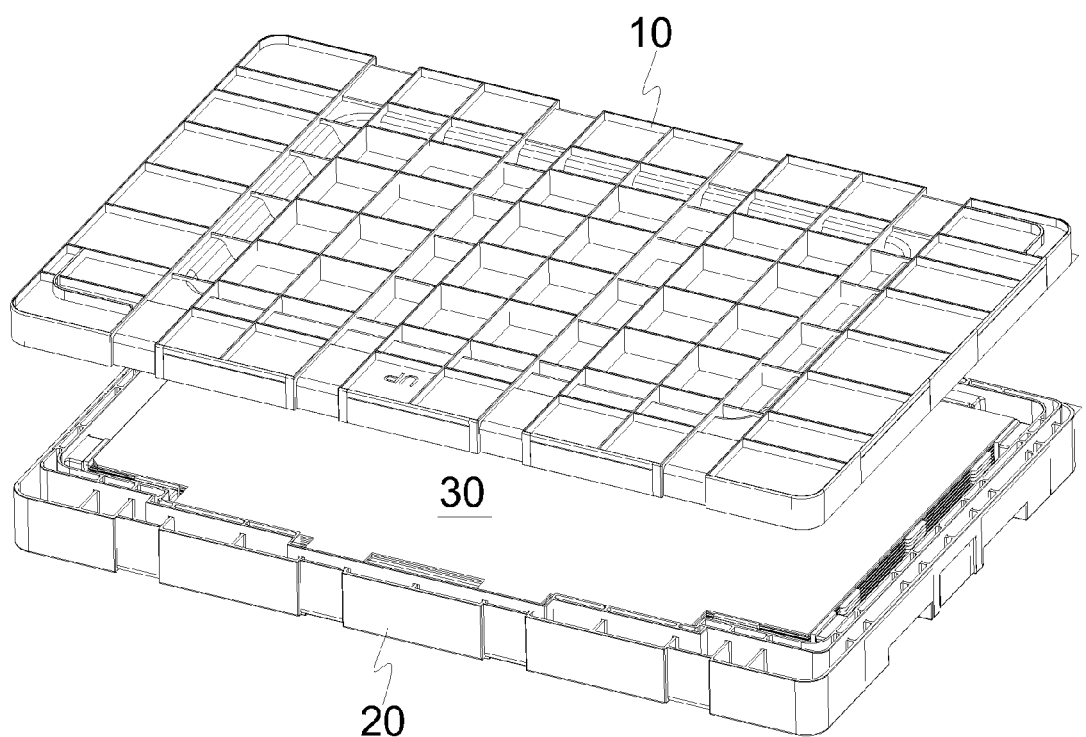
FIG. 11 is a schematic exploded view of a traditional apparatus for packaging liquid crystal glass substrates.
Figure 12:
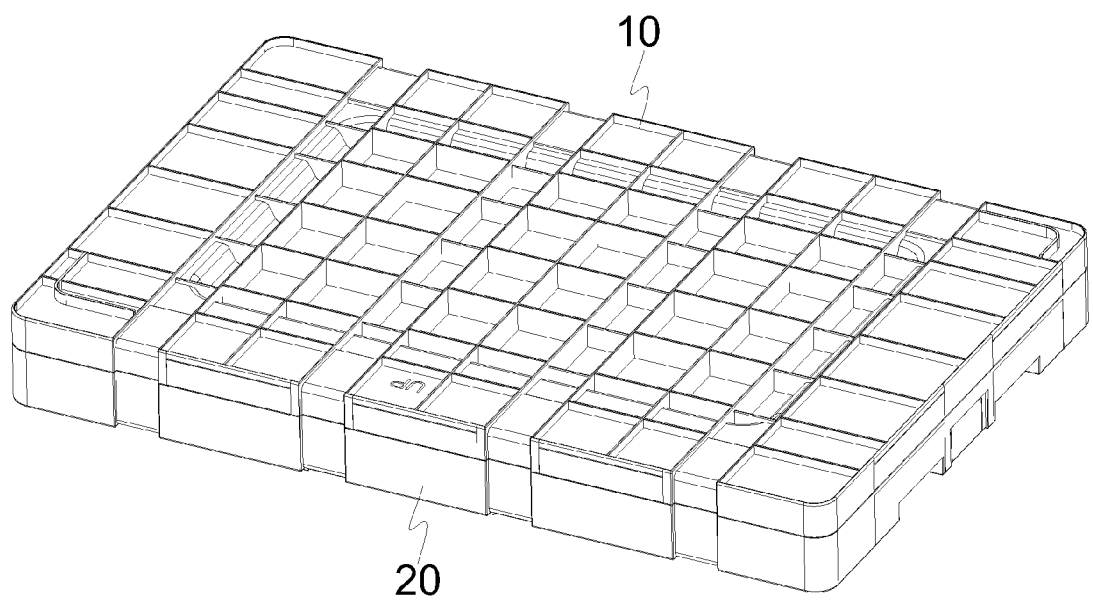
FIG. 12 shows the assembled state of the apparatus for packaging liquid crystal glass substrates in FIG. 11.
Figure 13:
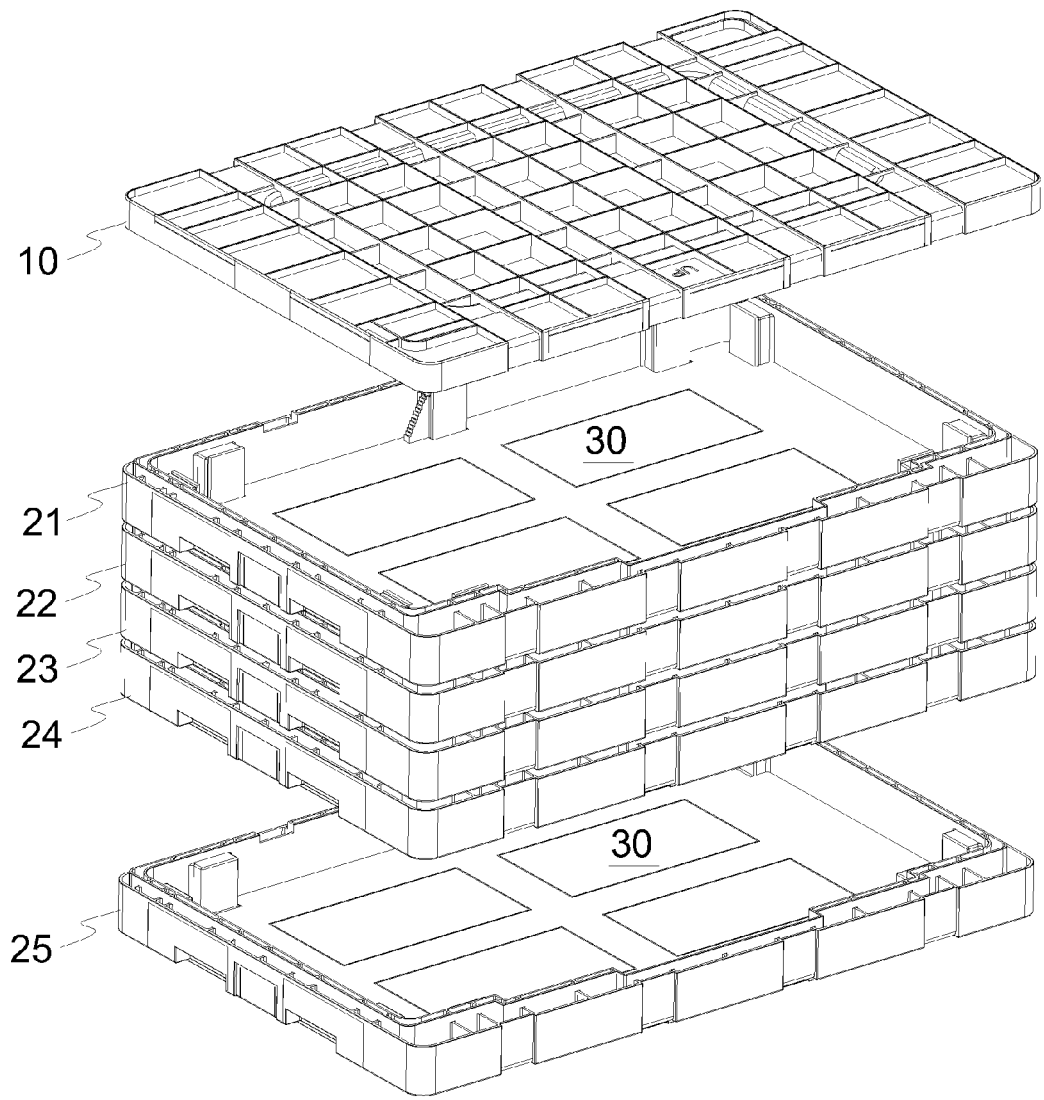
FIG. 13 is a schematic exploded view of another traditional apparatus for packaging liquid crystal glass substrates.
Figure 14:
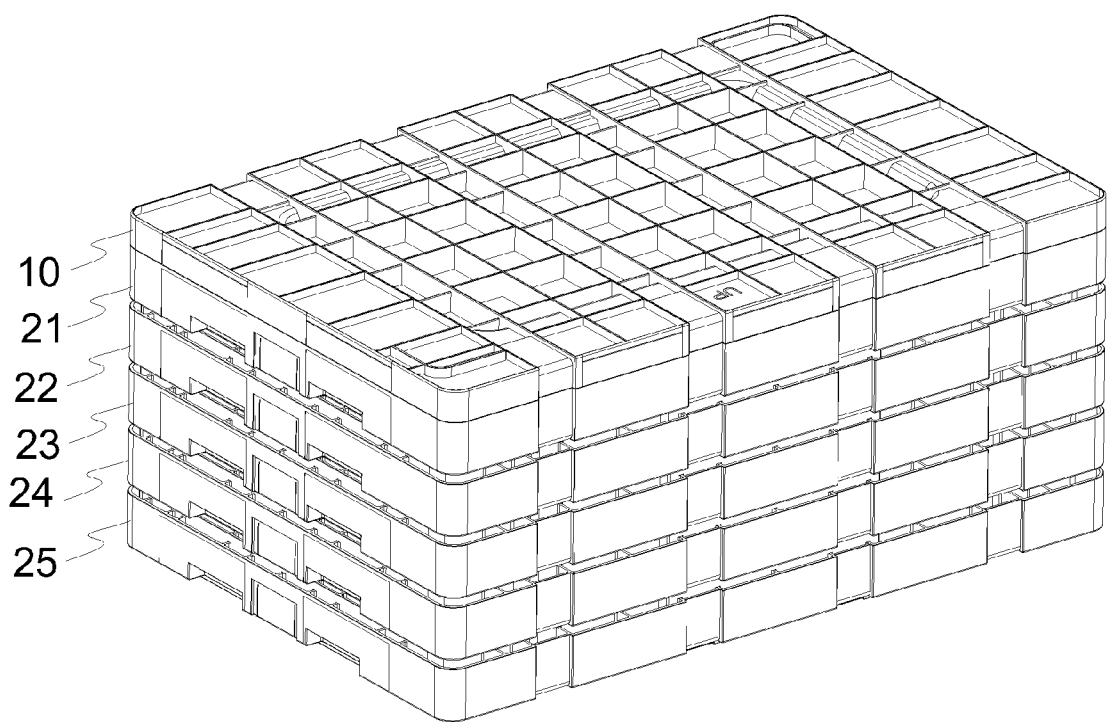
FIG. 14 shows the assembled state of the apparatus for packaging liquid crystal glass substrates in FIG. 13.

FIG. 9 and FIG. 10 shows a variant of the clamp (unit forming member) of the apparatus for packaging liquid crystal glass substrates. As the same with the first clamp 400, this clamp 600 also comprises a first clamping portion 604, a clamping body 602 and a second clamping portion 606. The difference between the first clamp 400 and the clamp 600 is that both the first clamping portion 604 and the second clamping portion 606 are provided with a hook. As shown in FIG. 9 and FIG. 10, the first clamping portion 604 is provided with a hook 608; the second clamping portion 606 is with a hook 610. In this embodiment, the hook 608 and the hook 610 is sharp. However, the hook 608 and the hook 610 can be blunt as needed. By means of the hooks, the clamps can be connected with the housing unit more tightly.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An apparatus for packaging liquid crystal glass substrates, comprising multiple housings, a cover and a unit forming member, wherein the multiple housings are overlapped together in vertical direction, the cover covers the topmost housing of the multiple housings, each housing comprises a cavity for receiving a liquid crystal glass substrate, the unit forming member is configured to clamp at least two housings of the multiple housings together as a housing unit, the unit forming member comprises at least one clamp, wherein each clamp comprises a first clamping portion, a clamping body and a second clamping portion, the first clamping portion and the second clamping portion are connected with the clamping body, wherein each housing is provided with a first groove engaging with the first clamping portion and a second groove engaging with the second clamping portion, wherein both the first clamping portion and the second clamping portion are provided with a hook, a cross section of the hook being triangular.

2. The apparatus for packaging liquid crystal glass substrates of claim 1, wherein each clamp is press-fitted with the top surface and the bottom surface of the housing unit.

3. The apparatus for packaging liquid crystal glass substrates of claim 1, wherein each clamp is in square-bracket shape.

4. The apparatus for packaging liquid crystal glass substrates of claim 1, wherein the housing unit comprises three or more housings.

5. The apparatus for packaging liquid crystal glass substrates of claim 1, wherein each clamp is located at the side of the housing unit.

6. The apparatus for packaging liquid crystal glass substrates of claim 1, wherein each clamp is made of plastic or metal.

7. The apparatus for packaging liquid crystal glass substrates of claim 1, wherein each clamp is made of ABS plastic.

8. The apparatus for packaging liquid crystal glass substrates of claim 1, wherein each clamp is made of HDPE plastic.

9. The apparatus for packaging liquid crystal glass substrates of claim 1, wherein each clamp is made of PP plastic.

10. The apparatus for packaging liquid crystal glass substrates of claim 3, wherein each clamp comprises a first clamping portion, a clamping body and a second clamping portion, the first clamping portion and the second clamping portion are connected with the clamping body.

11. The apparatus for packaging liquid crystal glass substrates of claim 10, wherein each housing is provided with a first groove engaging with the first clamping portion and a second groove engaging with the second clamping portion.

12. The apparatus for packaging liquid crystal glass substrates of claim 10, wherein both the first clamping portion and the second clamping portion are provided with a hook.

* * * * *